United States Patent [19]

Schmid

[11] Patent Number: 5,335,681
[45] Date of Patent: Aug. 9, 1994

[54] APPARATUS FOR THE TREATMENT OF BOARD-LIKE ARTICLES, PARTICULARLY PRINTED CIRCUIT BOARDS

[75] Inventor: Christian Schmid, Freudenstadt, Fed. Rep. of Germany

[73] Assignee: Gebr. Schmid GmbH & Co., Freudenstadt, Fed. Rep. of Germany

[21] Appl. No.: 902,320

[22] Filed: Jun. 22, 1992

[30] Foreign Application Priority Data

Jun. 26, 1991 [DE] Fed. Rep. of Germany ....... 4121032

[51] Int. Cl.$^5$ .................................. D06B 3/02
[52] U.S. Cl. ........................... 134/64 R; 15/302; 15/307; 15/309.2; 118/50; 134/122 R; 134/902
[58] Field of Search .................. 134/64 R, 64 P, 72, 134/122 R, 122 P, 126, 131, 151, 902; 15/302, 307, 309.1, 309.2, 345; 118/50

[56] References Cited

U.S. PATENT DOCUMENTS

| | | | |
|---|---|---|---|
| 1,576,163 | 3/1926 | Voelker | 15/307 |
| 1,789,132 | 1/1931 | Birch | 15/307 |
| 2,164,174 | 6/1939 | Gerard et al. | 15/307 |
| 2,471,330 | 5/1949 | Knight et al. | 118/50 X |
| 2,499,572 | 3/1950 | Dunakin et al. | 15/345 X |
| 3,045,273 | 7/1962 | Bruno | 15/307 X |
| 3,172,780 | 3/1965 | Csok et al. | 118/50 |
| 3,495,932 | 2/1970 | Tuma | 15/345 X |
| 3,749,053 | 7/1973 | Timson | 118/50 |
| 3,956,790 | 5/1976 | Ishiwata et al. | 134/64 P X |
| 4,044,716 | 8/1977 | Riddle | 15/307 X |
| 4,102,299 | 7/1978 | Wallsten | 118/50 |
| 4,173,945 | 11/1979 | McFarland | 118/50 X |
| 4,288,475 | 9/1981 | Meeker | 118/50 X |
| 4,736,221 | 4/1988 | Shidara | 134/64 P X |
| 4,773,110 | 9/1988 | Hopkins | 15/307 X |
| 4,926,520 | 5/1990 | Watson | 15/309.2 X |
| 4,968,534 | 11/1990 | Bogardy | 118/50 X |

FOREIGN PATENT DOCUMENTS

| | | |
|---|---|---|
| 320482 | 6/1989 | European Pat. Off. . |
| 2619821 | 11/1977 | Fed. Rep. of Germany . |
| 3813518 | 11/1989 | Fed. Rep. of Germany . |
| 201161 | 1/1966 | Sweden ............ 15/309.1 |
| 1444138 | 7/1976 | United Kingdom ...... 15/309.1 |

*Primary Examiner*—Philip R. Coe
*Attorney, Agent, or Firm*—Barry R. Lipsitz

[57] ABSTRACT

In order when treating printed circuit boards with liquids, particularly during cleaning, etching, metallizing or rinsing, to achieve a precisely time measurable and effective treatment, the area supplied by means of a spray or swell nozzle or a stationary wave is limited by suction devices (24, 25, 41, 42). The latter are positioned upstream and downstream of the application (28, 38). The spray or suction nozzles (22, 24, 25) are arranged in a common casing and the boards (12) to be treated move horizontally passed its lower periphery.

20 Claims, 7 Drawing Sheets

APPARATUS FOR THE TREATMENT OF BOARD-LIKE ARTICLES, PARTICULARLY PRINTED CIRCUIT BOARDS

BACKGROUND OF THE INVENTION

The invention relates to an apparatus for the treatment of board-like articles, particularly printed circuit boards, with a fluid treatment medium, particularly a cleaning, etching, metallizing or rinsing liquid, along a substantially horizontal conveying path, the treatment medium being applied by means of an applicator, particularly a spray, splash or swell nozzle, or by means of a stationary wave to the board surface.

Such apparatuses have been extensively used up to now, particularly for the production of printed circuit boards.

With the increasing integration density of the components on the printed circuit boards, it is necessary to continuously reduce the width of the conductors and the reciprocal conductor spacing. The smaller the dimensions of the conductors, the more important it is to prevent any undercutting of the conductors. Also in connection with various other treatment steps for printed circuit boards, it is becoming increasingly important to allow the treatment medium to act over a precisely controllable time on the surfaces of the boards. With a view to achieving a maximum flow rate the treatment time per board surface also plays a part, so that a minimum board surface treatment time is sought. Simultaneously the treatment result must have a constant quality and it must in particular be ensured that the gaps between the conductors no longer have any residual copper cladding.

These aspects became even more important in connection with the production of multilayer boards, in which the overall board is only obtained after joining together a plurality of individual electronic printed circuit boards and only then can testing for functional characteristics take place. The possibilities of faults are multiplied with the number of layers and simultaneously there in an increase in the damage resulting from the failure of one board.

OBJECTS OF THE INVENTION

An object of the present invention is to improve an apparatus for the treatment of board-like articles of the aforementioned type in such a way that the board surface can be treated with a treatment medium for a precisely time-limitable period and is also given a time-average constant treatment.

SUMMARY OF THE INVENTION

According to the invention in an apparatus of the aforementioned type it is provided that, considered in the conveying direction upstream and downstream of the applicator, suction or similarly effective devices are provided with suction openings or the like facing the board surface and extending substantially over the entire width of the conveying path and by means of which a surface area of the board, which at one time is in contact with the treatment medium, can be predefined and limited in its extension along the conveying direction.

The arrangement of the applicator between the two suction devices in the conveying direction leads to the advantage that the treatment medium is conveyed along the board surface parallel to the conveying direction and the board surface area treated at a particular time is precisely definable by the suction devices or their suction openings.

Simultaneously on the board surface there is an intense liquid exchange as a result of the forced medium flow, so that for the treatment stage unconsumed medium is always supplied. This not only ensures a constant, good treatment result, but also reduces the necessary treatment time to a minimum. This make it possible to perform extremely accurately time definable treatment stages and problems such as e.g. a significant undercutting of the conductors are avoided.

Particularly when treating the top board surfaces problems were always encountered in the past as a result of uneliminated treatment medium residues which, other than in the case of the bottom, remain in contact with the board surface for a relatively long time, whereas in the case of the bottom the excess treatment liquid generally drips off.

It has therefore been proposed that the printed circuit boards are only treated on one side, namely on the bottom, after which they are turned over. This problem can at least be obviated in a number of cases by the present invention, which makes it possible to simplify and speed up the production of printed circuit boards, which require maximum treatment precision.

In the case of the apparatus according to the invention it is of minor importance whether the treatment liquid is applied by means of spray or swell nozzles or by means of a stationary wave, the latter term being understood to means a constantly replenished liquid volume, through which the board is conveyed with one or both surfaces.

For spray protection reasons and to increase the efficiency of the suction devices, it is advantageous to place the applicator and the suction devices in a common casing.

Advantageously sealing elements are fitted to the casing and are kept in sealing contact with the board surface, so that the casing with the applicator and suction devices forms with the board surface an area which is sealed with respect to the environment. This leads to an optimum utilization of the suction efficiency of the suction devices for sucking off and removing the treatment medium from the board surface and a particularly complete removal of the treatment medium from the board surface is ensured. The measures described up to now in connection with the inventive apparatus give an excellent result if the circuit boards have the maximum possible width and therefore correspond to the working width of the overall installation.

In the case that an apparatus according to the invention is to be usable for the treatment of boards having a varying width, it is advantageous to place on the side of the conveying plane facing the casing with the applicator and the suction devices, a sealing device cooperating with the casing, so that no longer does the casing and the board surface have to form a substantially closed space and instead the latter is formed by the casing and the sealing device placed on the opposite side. Thus, independently of the width of the circuit boards being treated, this leads to a space or area which is substantially sealed with respect to the surrounding area in which it is possible to maintain a vacuum. An unintentional escape of liquid treatment medium is consequently limited to the minimum. The sealing device placed on the opposite side of the conveying plane, can comprise e.g. three rollers in engagement with one another on their circumference and which extend over the entire width of the installation. The central roller of the three should have a somewhat smaller circumference than the two others or its rotation axis should be somewhat further from the conveying plane than the two neighbouring rollers.

This arrangement substantially prevents air freely entering the space or area if the printed circuit boards do not fill the entire working width of the installation or if the boards have a plurality of bores or holes.

The sealing elements of the casing preferably have brush segments, which normally sealing engage on the circumference of the rollers of the sealing device located on the opposite side. They provide free passage to the board in the area traversed by the latter.

Alternatively thereto the sealing elements can comprise squeezing rollers, which are on the one hand sealed with a sealing lip relative to the casing and on the other engage on the surface of the board or, in cases where no board has been introduced into the apparatus, on the opposite roller of the sealing device.

Up to now the arrangement of the applicator and the suction device on one side of the conveying plane has been discussed. However, it would advantageously also be possible to have the applicator and suction device as a second unit on the opposite side of the conveying plane.

If the inventive construction is to be used for treating the bottom of the printed circuit board, it is advantageous to construct the apparatus as a stationary wave and then the space below the board is substantially completely filled with medium and the entire area of the board by which it is located between the suction devices is wetted by the treatment liquid. The applicator and suction device can be positioned directly facing one another above and below the conveying plane, so that the casing surrounding the same can be in sealing contact with one another and therefore replace the sealing device, which otherwise must be arranged in facing manner.

Alternatively the applicator and suction device positioned above and below the conveying plane can be reciprocally displaced in the conveying direction. This in particular makes it possible to arrange a stationary wave below the conveying plane, whereas above said plane the treatment of the board surface is carried out with a swell or spray nozzle as the applicator.

The problem of the loss of effectiveness of the suction devices in the case of varying printed circuit board widths can also be limited in that working width of the suction devices can be adjusted by means of a variable covering of the suction openings on the width of the boards to be treated. Therefore there is no need for the suction device on the facing side of the conveying plane.

One of the advantageous developments of the variable covering is that it comprises a flexible, liquid-tight belt partly engaging on the suction opening and having an elongated, window-like opening, the area of the overlap of the window-like opening of the belt and the suction opening being adjustable.

The setting of the working width of the suction opening is brought about in that the window-like opening or the closed part of the belt overlaps a more or large part of the suction opening.

The belt can be wound onto two rolls and can be spooled between them and in this way can free or cover a larger or smaller part of the suction opening. Alternatively the belt can be constructed as an endless belt, so that a drive can be limited to one of the necessary guide rollers.

Advantageously with each suction device are associated two belts, which in each case close the suction openings from the marginal area of the conveying planes, so that the circuit boards, which are narrower than the maximum working width of the apparatus can be introduced in random relative arrangement with respect to the working width through the machine. The belts can be driven in opposition to one another.

It is possible to manually drive the belts and fix the corresponding width of the suction openings. However, advantageously this task is fulfilled by an automatic control mechanism, which comprises a sensor for determining the board width and the board position in the conveying plane. As a function of the sensor signal, the control mechanism will then generate adjustment signals, which are supplied to the variable covering means and cause the latter to move the belts from the marginal area over the suction opening, so that the still open part of the suction openings has precisely the width of the boards and in the transverse direction to the conveying path corresponds to the board position.

An alternative possibility for the variable sealing of the suction openings of the suction devices is to equip the variable cover with a plurality of sealing elements, which can be moved from a closed into an open position when the boards pass through the apparatus, so that the suction opening of the suction devices is only freed in the vicinity of the board. Therefore the leading edge of the board can free a gap between the suction opening and the sealing device, the areas of the suction opening not covered by the board surface remaining closed by the variable cover. This variable covering procedure has the particular advantage that it does not require a complicated control mechanism and, with respect to the conveying plane, is set automatically to the board width and position. In addition, the suction openings are closed at the instant when no circuit board is passing through the apparatus.

The sealing elements can be constructed so as to pivot about a common axis or shaft. Preferably the sealing elements are pressed with a slight pretension against the suction opening, so as to ensure a reliable closure of the latter at the instant in which the board releases the suction opening. The sealing elements can have a lever-like construction, or can be in the form of circular or disk-shaped bodies. These bodies can also be pretensioned against the suction opening, e.g. by a plurality of leaf springs, or e.g. by floating in a liquid or by their own weight.

BRIEF FIGURE DESCRIPTION

These and further advantages of the invention are described in greater detail hereinafter relative to the drawings, wherein show:

FIG. 1 A diagrammatic sectional view through an apparatus according to the invention.

FIG. 2 A detail of the apparatus of FIG. 1.

FIG. 3 A variant of the applicator and suction device according to the invention.

FIG. 4 A mirror-inverted apparatus for the application and suction of the treatment medium above and below the conveying plane.

FIG. 5 An inventive apparatus for varying the working width thereof.

FIG. 6 An alternative embodiment for varying the working width of the inventive apparatus.

FIG. 7 Another variant for adapting the working width of the inventive apparatus.

FIG. 8 An additional variant for adjusting the working width of the inventive apparatus.

DETAILED DESCRIPTION OF PREFERRED EXAMPLE EMBODIMENTS

Figure 1:
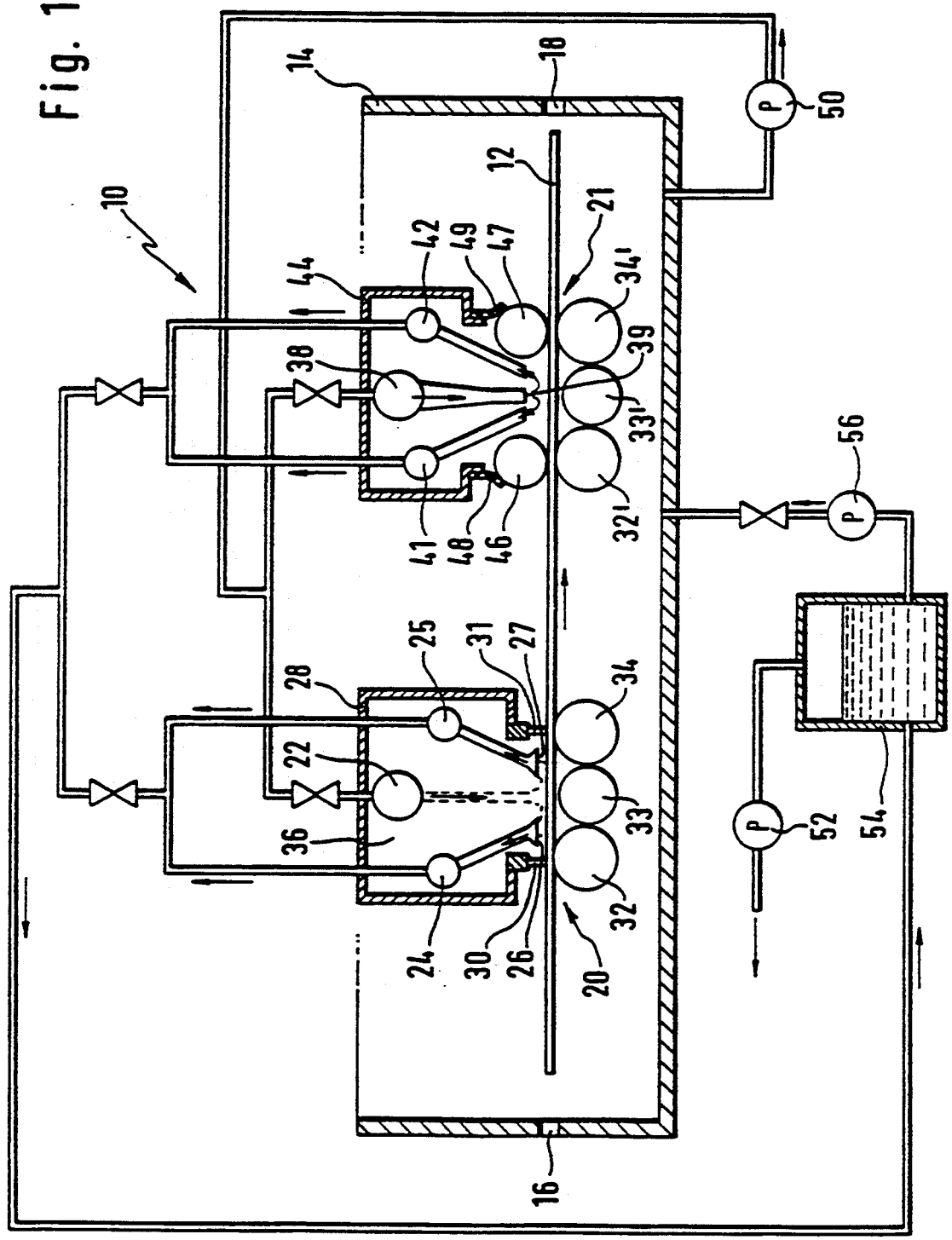

FIG. 1 is a diagrammatic sectional view through an overall apparatus 10 according to the invention parallel to the conveying direction of printed circuit boards 12, which in the apparatus are exposed to the action of a treatment liquid, e.g. for cleaning, etching, metallizing, etc.

The conveying path of the printed circuit boards 12 through the overall apparatus 10 is defined by a conveying means, which is not shown here for reasons of simplicity.

The circuit boards enter a casing 14 of the overall apparatus 10 through an entrance gap 16 and leave the casing 14 of the apparatus at the opposite end through an exit gap 18. On their way from the entrance gap 16 to the exit gap 18 the printed circuit boards 12 are subject to the action of a treatment liquid in two treatment zones 20, 21, FIG. 1 showing two different variants of an inventive construction. However, there can be only a single treatment zone, or three or more such zones within a casing 14.

The construction of the two treatment zones 20, 21 is only different here for the purpose of illustrating several different embodiments of the invention and can be identical or a reversed arrangement can be provided in the conveying direction.

The treatment zone 20 is defined by a spray tube 22 as the applicator, as well as two suction nozzles 24, 25 as suction devices. The spray tube 22 is positioned above the conveying plane of the printed circuit boards 12 and distributes the treatment liquid in the form of a flat jet onto a small area of the board, when considered in the conveying direction. Considered in the conveying direction upstream and downstream of the spray tube 22, the suction nozzles 24, 25 with their suction openings 26, 27 facing the board surface take the treatment liquid up from said board surface.

To avoid an unintentional escape of the treatment medium, which is often an aggressive treatment liquid, as well as for increasing the suction effect of the two suction nozzles 24, 25, the spray tube 22 and the suction nozzles 24, 25 are housed in a common casing or cover 28, which by means of brush segments 30, 31 sealingly engages with respect to the surface of the board 12.

On the side of the conveying plane facing the cover 28 is provided a sealing device in the form of three rollers 32, 33, 34, which have reciprocally engaging circumferences. The radius of the roller 33 is somewhat smaller than the radius of the rollers 32, 34 and the circumferential surface of the roller 33 maintains a spacing from the conveying plane of the apparatus, so that it is not in contact with the bottom of the printed circuit board 12.

As they are in contact with the conveying plane, the rollers 32, 34 can be concomitantly used for conveying the printed circuit boards through the apparatus and consequently form part of the conveying means. The rollers 32 and 34 can be e.g. centrally driven by the roller 33. However, the rollers 32 and 34 can also be merely constructed as idle rollers and rotate the roller 33 on traversing the boards 12. In this case there should be at least one further driving roller along the apparatus conveying path. The sealing rollers 32, 33, 34 cooperate with the brush segments 30, 31 and extend over the entire working width of the apparatus, like the cover 28.

Together with the cover they form an evacuatable space 36 where, as a result of the sealing measures, a slight vacuum can be maintained. As a result of this measure a vacuum can also be maintained in the space 36 if boards with a smaller than the maximum working width of the apparatus are conveyed through the latter. Therefore the efficiency of the suction nozzles 24, 25 remains substantially constant independently of the particular board width being processed.

In principle, the treatment zone 21 has the same construction as the treatment zone 20, but in place of the spray tube 22 a slot-shaped swell nozzle 38 is used. The outlet opening 39 of the latter ends slightly above the circuit board surface and the liquid jet is subdivided into two partial flows, which pass parallel and antiparallel to the conveying direction and are taken up by the suction nozzles 41, 42.

Once again in the case of this arrangement a cover 44 is provided, which can be sealed with respect to the surface of the circuit board 12, e.g. with brush segments, as has been shown in connection with the treatment zone 20. However, alternatively, it is also possible to have a different form of sealing and the latter can also be transferred to the embodiment of the treatment zone 20.

The casing 44 is sealed with respect to the printed circuit board by means of squeezing rollers 46, 47, whose rotation axes are preferably vertically displaced and are located parallel to the rotation axes of the sealing rollers 32', 34' located on the other side of the conveying plane. The function of the sealing rollers 32', 33', 34' is the same as with sealing rollers 32, 33, 34, so that no more detailed description is required here. A sealing transition from the casing 44 to the squeezing rollers 46, 47 is formed by the sealing lips 48, 49, which resiliently engage on the circumference of the rollers 46, 47.

In the present embodiment the same liquid is supplied to the boards 12 in the treatment zones 20, 22, so that the casing 14 for the treatment liquid and the two treatment zones 20, 21 can form a common sump. From said sump the optionally regenerated treatment liquid is drawn off by means of the pump 50 and supplied to the applicators, namely the spray tube 22 and the swell nozzle 38, in the treatment zones 20 or 21.

The suction action by means of the suction nozzles 24, 25 and 41, 42 can also take place by means of a common vacuum pump 52, which is connected upstream of a container 54, which is used for separating the sucked off liquid and air fractions. A further pump 56 then returns the treatment medium from the container 54 into the common sump in the casing 14.

Figure 2:
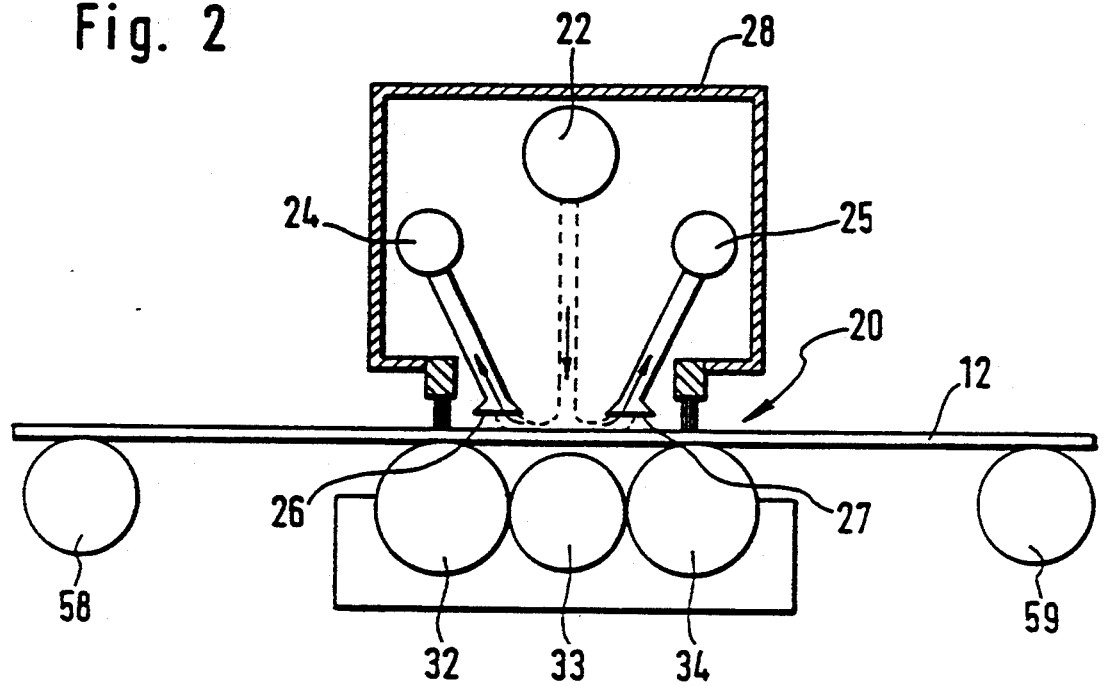

FIG. 2 shows the treatment zone 20 of FIG. 1 in somewhat more detail. The rolls 58, 59 support the printed circuit board 12 in the conveying direction and after traversing the treatment zone 20, forming part of the otherwise not further shown conveying means.

The drawing makes it clear how the suction openings 26, 27, widened in the direction of the board surface, take up the liquid from the latter and therefore ensure a precisely definable board area, which at a particular time undergoes treatment with the liquid.

The liquid jet passing out of the spray tube 22 is shown as a very sharply concentrated or focussed jet in the conveying direction. However, it is possible to use more widely fanned out spray jets.

Figure 3:
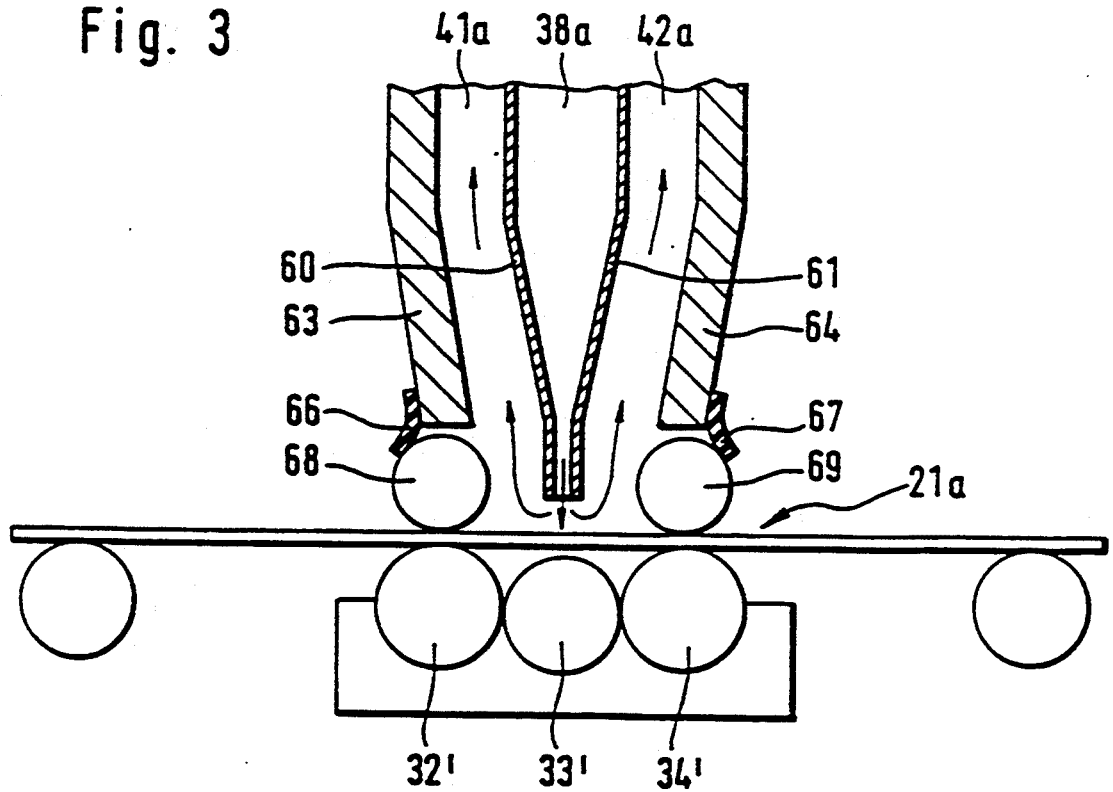

FIG. 3 shows in detail a treatment zone 21a, whose fundamental construction is the same as that of the treatment zone 21. The embodiment of FIG. 3 makes it clear that in a preferred embodiment the casing 44 of the treatment zone 21 can coincide with the walls of the suction nozzles 41, 42 and then there is an integrated swell/suction nozzle arrangement formed from the suction channels 41a, 42a, as well as the swell nozzle 38a. Whereas the swell nozzle 38a passes close to the surface of the printed circuit board, the suction opening of the suction nozzles 41a, 42 are formed by the walls 60, 61 of the swell nozzle 38a and by the walls 63, 64, terminated towards the board by means of the sealing lips 66, 67 and squeezing rollers 68, 69. The remaining construction corresponds to that of the treatment zone 21 in FIG. 1, so that reference should be made to the latter for further explanations.

Figure 4:
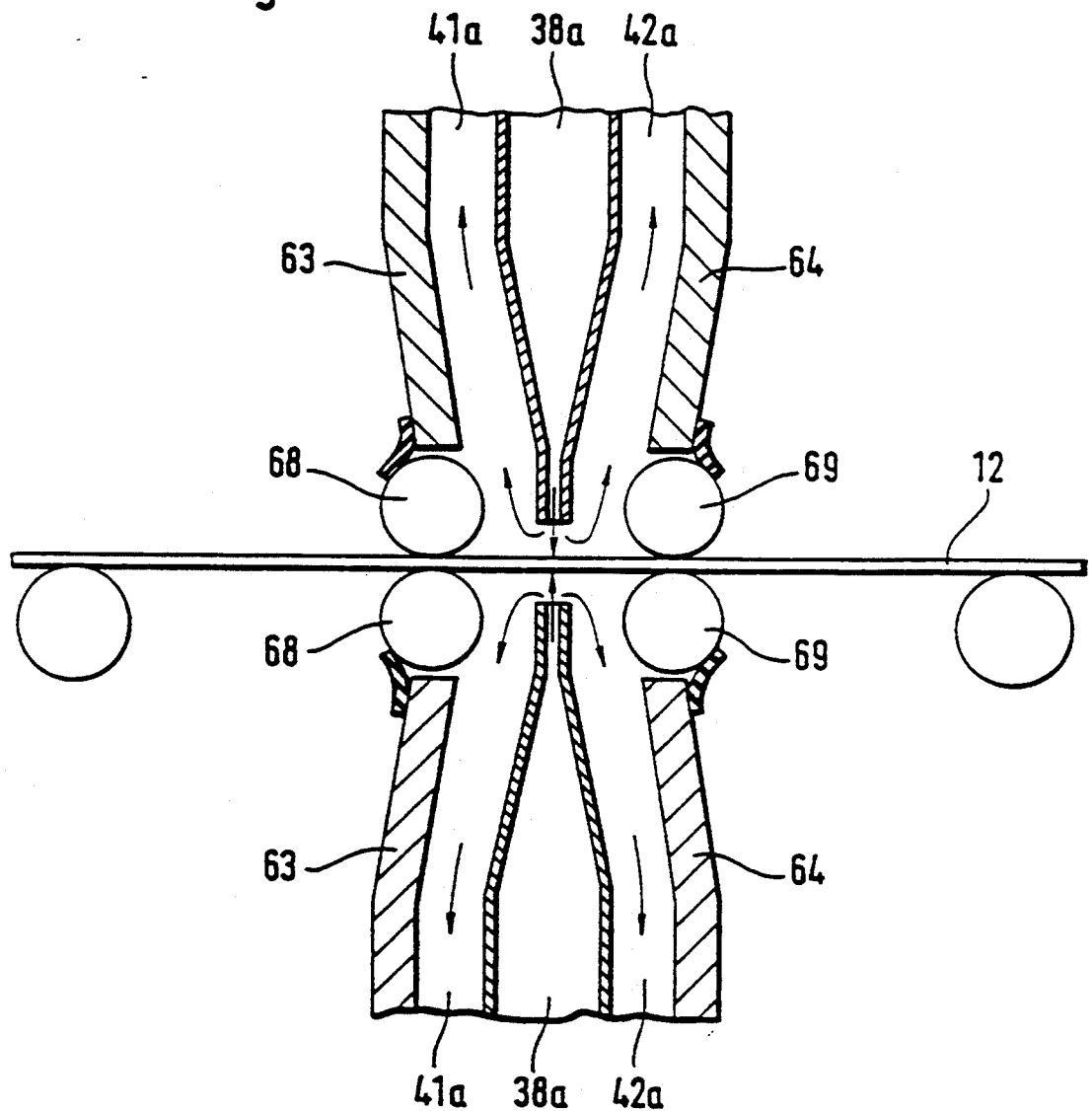

FIG. 4 shows the mirror-inverted arrangement of two treatment zones 21a above and below the conveying plane, so that it is possible to simultaneously treat the top and bottom of the printed circuit board and where the sealing rollers 32', 33', 34', which are otherwise necessary on the other side, are obviated.

In the case of printed circuit boards which have holes or bores, it is possible to clean or etch the same at the same time as the remainder of the board surface if this is desired, or in a separate treatment zone a special bore cleaning can take place.

The problem of the efficiency loss of the suction devices in cases where circuit boards are processed, whose width is smaller than the maximum working width of the apparatus, can be obviated in that the suction openings of the suction devices are closed to such an extent that they still leave an opening corresponding to the width of the boards being processed. In this case, optionally the cover surrounding the applicator and suction devices can be obviated, as can the sealing device on the opposite side of the conveying plane.

Figure 5:
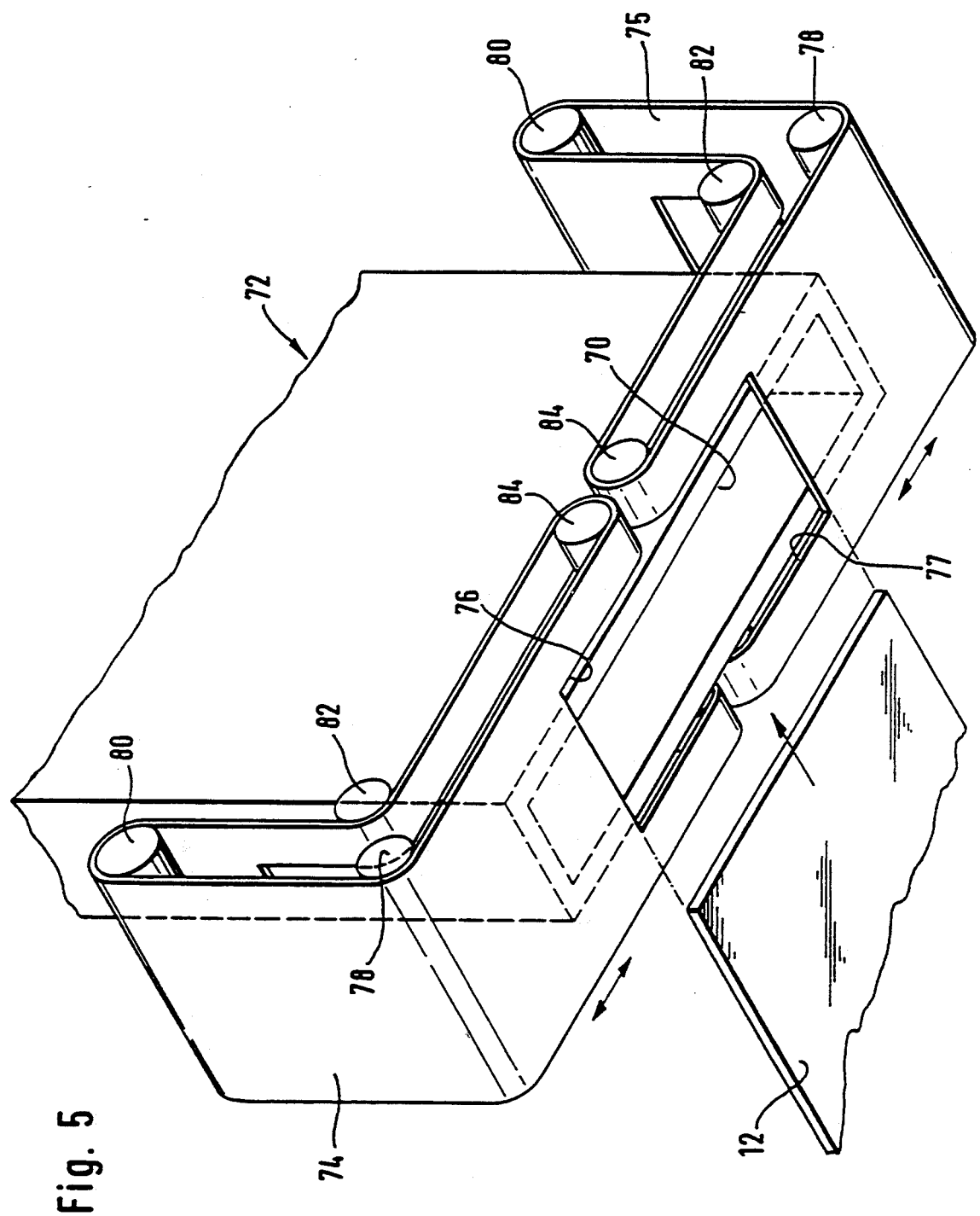

FIG. 5 shows one of the possible solutions for the problem of adapting the width to a diagrammatically shown suction nozzle 72 with a suction opening 70, said construction being applicable to all the previously described constructions of the treatment zones 20 and 21.

In the case of the treatment zone shown in FIG. 3, there is additionally a cover for the applicator, so that the escape of treatment liquid is limited to the area over which passes the circuit board.

On the underside of the nozzle 72 there are two endless belts 74, 75 part of one side being guided parallel to the plane of the suction opening 70 and at least partly sealingly engages on the latter. The endless belts 74, 75 have window-like openings 76, 77 which extend parallel to the belt rotation direction. The two endless belts 74, 75 are arranged symmetrically to the conveying path and to the nozzle 72 and are guided by means of several rolls. A first guide roll 78 is positioned laterally of the conveying path and its circumferential surface is approximately level with the conveying plane of the boards.

The guide rolls 78 deflect the belt of the conveying plane into the vertical and above the conveying plane guide rolls 80 guide back the belt into the conveying plane direction. Just above the conveying plane the belts coming from the roll 80 again undergo a 90° deflection by a further guide roll 82, so that this part of the endless belt 74 or 75 passes parallel to the conveying plane and in the direction of the centre of the conveying path. Roughly in the centre with respect to the working width are provided further guide rolls 84, which deflect the belt by 180° towards the edge of the conveying path.

The window part 76, 77 of the belts 74, 75 can be arranged with a varying degree of overlap with the openings 70 of the suction nozzles 72, which leads to a varying residual opening for the suction opening 70.

At least one of the rolls 78, 80, 82, 84 can be driven, so that the endless belt increases or decreases the overlap of the window parts 76, 77 with the suction opening by driving the belt in one or other direction.

The belts 74, 75 can be operated synchronously and also independently of one another, so that a precise adaptation of the residual opening of the suction opening 70 to the individual position of the board 12 in the conveying plane can be obtained.

Preferably this type of adaptation of the working width of the apparatus is linked with an electronic control, which by means of sensors establishes the necessary working width and the relative position of the boards with respect to the conveying plane and then generates signals by means of which the endless belts 74, 75 are so moved that a working width corresponding to the board width is obtained in an exact position, also relative to the conveying path width.

It is also possible to replace the endless belt 74 or 75 by an open belt, which is in part closed and in part has a window-like opening, the particular belt ends being would onto separate rolls and on varying the working width are wound from one roll to the other.

Figure 6:
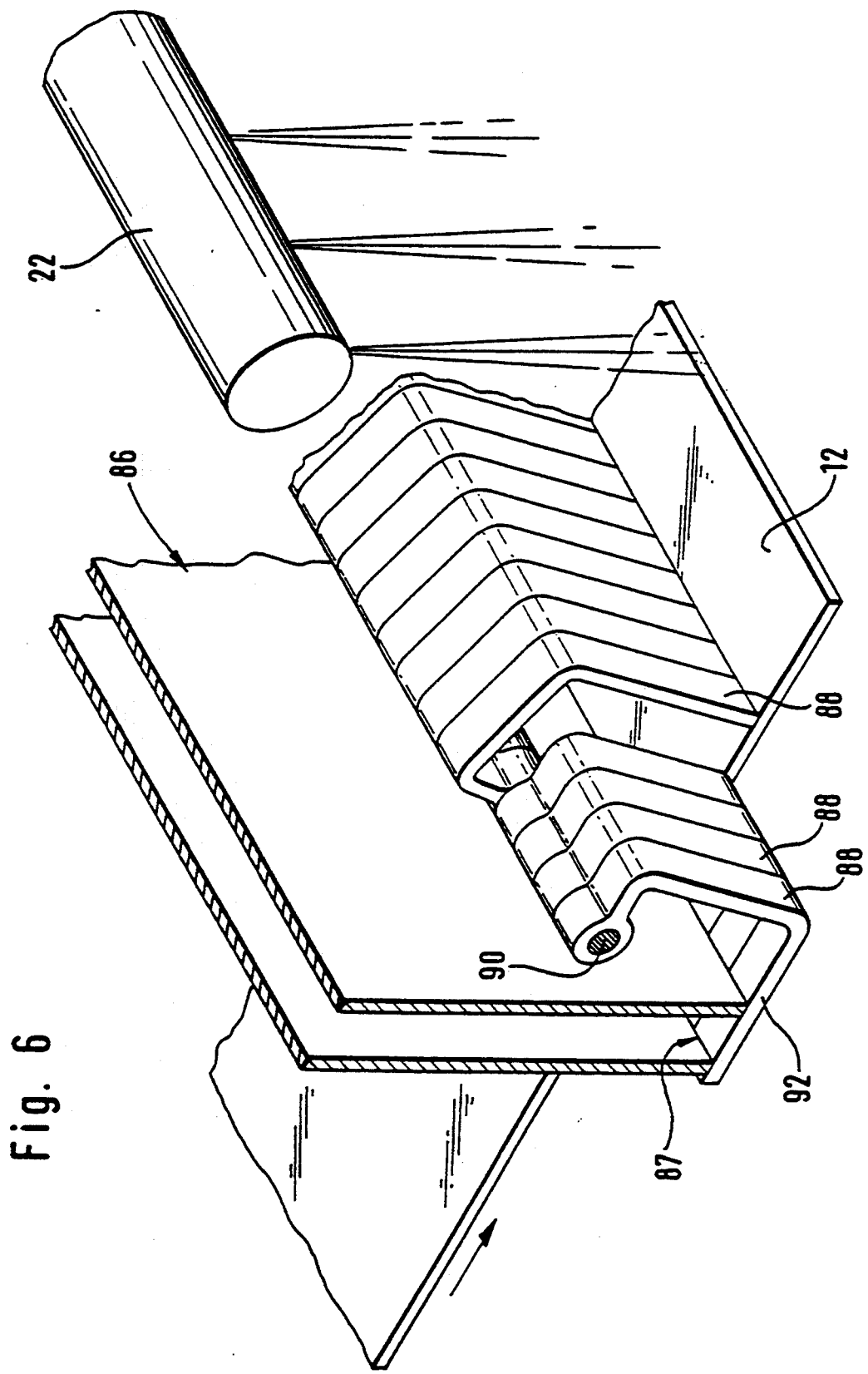
Figure 7:
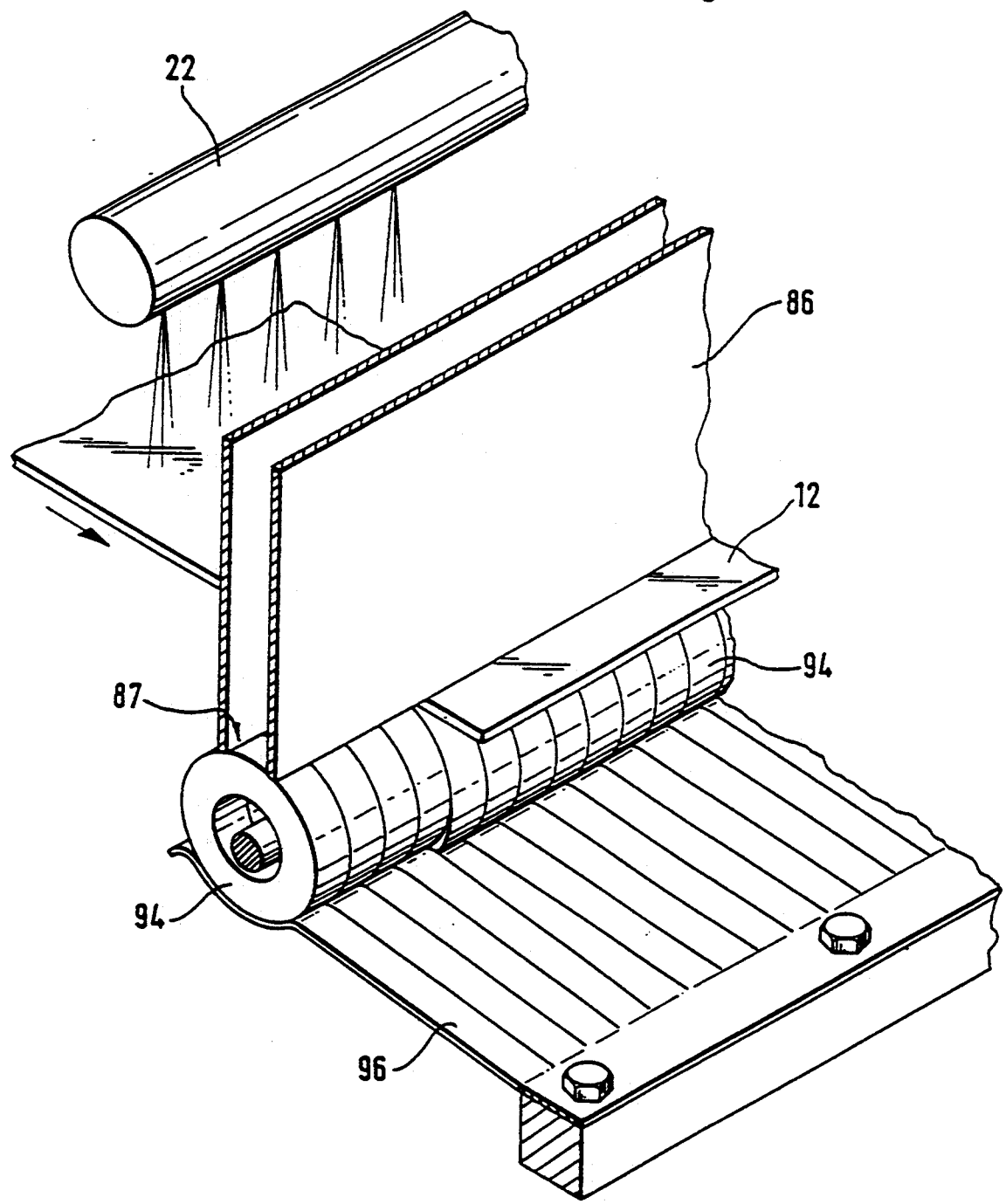
Figure 8:
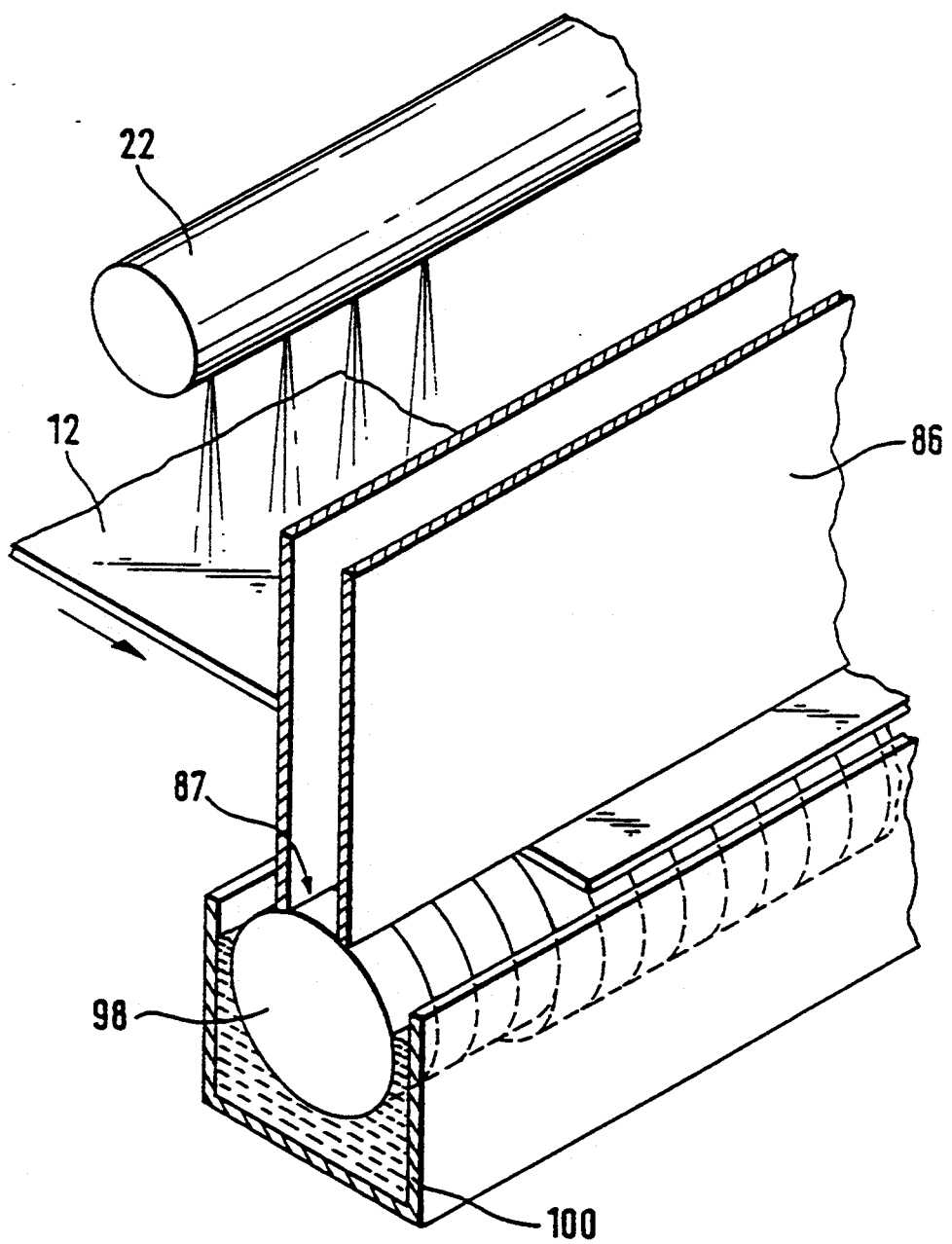

FIGS. 6, 7 and 8 show alternative solutions for an adaptation of the working width of the suction nozzles to the width of the circuit boards to be treated, these solutions having the advantage that the particular board to be processed itself brings about a corresponding suction opening width setting.

Considered in the conveying direction in FIG. 6, there are pivotable, lever-like sealing elements 88 following the suction nozzle 86 and which can in each case be pivoted about a shaft 90 independently of one another. For as long as no printed circuit board 12 enters the apparatus, the sealing elements 88 with their free end 92 seal the opening of the suction nozzle 86 and consequently reduce an overall suction device efficiency loss.

The leading end of the circuit board entering the apparatus encounters the free ends 92 of part of the sealing elements 88 and pivot the same in the conveying direction and also upwards and simultaneously in part the suction opening 87 of the suction nozzle 86 is freed, said situation being shown in FIG. 6.

As a result of the action of gravity or due to a pretension, the sealing elements 88 return to their starting position as soon as the circuit board 12 has passed through the apparatus. The applicator in the form of the spray nozzle 22 is only diagrammatically shown and can obviously be constructed as a swell nozzle or the like.

Following the spray nozzle 22 there is the same arrangement of the suction nozzle 86 with the sealing elements 88 and for reasons of simplicity this is not shown in FIG. 6.

A similar principle to that of FIG. 6 is shown in FIG. 7, but the sealing elements 88 are replaced by circular sealing elements 94, which are individually pressed against the suction opening 87 by means of spring tongues 96. As soon as the printed circuit board 12 enters the apparatus, the sealing rings 94 are pressed away from the suction opening 87 by the leading edge of the board 12 and consequently free the suction opening 87 with precisely the width of the board 12.

In the case of FIG. 7 it is possible to see the suction nozzle following in the applicator conveying direction and the nozzle upstream of the conveying direction has the same arrangement, not being shown for reasons of simplicity.

Finally, FIG. 8 shows another variant, in which the closed body, which is cylindrical on its outer circumference, is pressed against the suction opening 87 of the nozzle 86. The special nature of the embodiment of FIG. 8 is that the bodies 98 are arranged in a channel 100, where there is an accumulation of the liquid, particularly the treatment medium, which gives the bodies 98 buoyancy and leads to a floating of the sealing bodies 98 in the direction of the suction opening 87. At the time of the passage of the board 12 the bodies 98 are displaced from the suction opening 87 in the vicinity of the board width and permit the passage of the board.

When the printed circuit board has entirely passed out of the apparatus, as a result of the buoyancy caused by the liquid which has accumulated in the channel 100, the bodies are pressed upwards in the direction of the suction opening 87 of the suction nozzle 86 and immediately seal the same.

I claim:

1. Apparatus for treating board-like articles with a fluid treatment medium, comprising:
   conveying means for conveying said articles on a substantially horizontal conveying path in a conveying direction through a surface treatment area;
   restricted surface area treatment means situated adjacent to the conveying path including:
   applicator means situated in said surface treatment area for applying said fluid treatment medium to a restricted surface area of the articles that is limited by boundaries, and
   suction means for removing said fluid treatment medium from said articles near at least one of said boundaries by suction;
   wherein said restricted surface area treatment means define an operating width adjustable with at least one variable cover to accommodate an overall width extension of the restricted surface area; and
   wherein at least one of said covers is a belt, said covers being drivingly adjustable in opposite directions.

2. Apparatus according to claim 1, wherein said suction means have at least one suction opening facing the surface treatment area.

3. Apparatus according to claim 1, wherein said article defines an entire width extension between lateral edges thereof, said restricted surface area extending substantially over said entire width extension.

4. Apparatus according to claim 1, wherein said restricted surface area treatment means restrict said restricted surface area at one instant in time to a predetermined partial length section of an article being treated, said partial length section being substantially shorter than an overall length extension of the article being treated and parallel to said conveying direction.

5. Apparatus according to claim 1, wherein said applicator means and said suction means are arranged in at least one common casing.

6. Apparatus according to claim 5, wherein said casing incorporates at least one sealing element for sealingly engaging an article being treated.

7. Apparatus according to claim 6, wherein on a side of the article being treated remote from said at least one sealing element, supporting means are provided for supporting the article towards sealing engagement substantially over an overall width extension of said restricted surface area treatment means.

8. Apparatus according to claim 1, wherein means are provided for establishing a negative pressure substantially over an overall extension of said restricted surface area.

9. Apparatus according to claim 1, wherein said restricted surface area treatment means have at least one brush element bridging a gap associated with at least one of said boundaries.

10. Apparatus according to claim 1, wherein said restricted surface area treatment means comprise at least one squeezing roller.

11. Apparatus according to claim 1, wherein the articles define opposite extended article surfaces, at least one of said restricted surface area treatment means being arranged for operating on both sides of the articles.

12. Apparatus according to claim 11, wherein said conveying path defines a substantially horizontal conveying plane, with at least one of said restricted surface area treatment means being arranged below said conveying plane to provide an evacuatable space extending below said conveying plane.

13. Apparatus according to claim 11, wherein at least one of said restricted surface area treatment means is provided on either side of a conveying plane defined by said conveying path, with at least two of said restricted surface area treatment means being displaced with respect to each other in the conveying direction.

14. Apparatus according to claim 1, wherein control means are provided for positively adjusting said operating width, at least one sensor being provided for detecting a position and a width extension of an article being treated, said control means generating adjusting signals for varying said operating width as a function of sensor signals provided by said at least one sensor.

15. Apparatus according to claim 1, wherein the articles comprise electronic printed circuit boards.

16. Apparatus according to claim 1, wherein the treatment medium contains at least one of a cleaning liquid, an etching liquid, a metallizing liquid and a rinsing liquid.

17. Apparatus according to claim 1, wherein said applicator means comprise at least one of a spray nozzle, a swell nozzle and a stationary wave creating means for applying the treatment medium to said articles.

18. Apparatus for treating board-like articles with a fluid treatment medium, comprising:
   conveying means for conveying said articles on a substantially horizontal conveying path in a conveying direction through a surface treatment area; and
   restricted surface area treatment means situated adjacent to the conveying path including:
   applicator means situated in said surface treatment area for applying said fluid treatment medium to a restricted surface area of the articles that is limited by boundaries, and suction means for removing said fluid treatment medium from said articles near at least one of said boundaries by suction;

wherein said restricted surface area treatment means define an operating width adjustable with at least one variable cover to accommodate an overall width extension of the restricted surface area, said variable cover comprising at least one flexible, liquid-tight belt for variably at least partly covering at least one fluid passage opening of said restricted surface area treatment means, said belt having an elongated, window-shaped opening defining an overlapping area common with said fluid passage opening, and wherein means are provided for varying said overlapping area.

19. Apparatus for treating board-like articles with a fluid treatment medium, comprising:

conveying means for conveying said articles on a substantially horizontal conveying path in a conveying direction through a surface treatment area; and restricted surface area treatment means situated adjacent to the conveying path including:

applicator means situated in said surface treatment area for applying said fluid treatment medium to a restricted surface area of the articles that is limited by boundaries, and suction means for removing said fluid treatment medium from said articles near at least one of said boundaries by suction;

wherein said restricted surface area treatment means define an operating width adjustable with at least one variable cover to accommodate an overall width extension of the restricted surface area, said restricted surface area being bounded by two opposed covers having through openings commonly defining a window-like opening bounded substantially over its entire perimeter by said covers.

20. Apparatus according to claim 19, wherein at least one of said covers is a belt, said covers being drivingly adjustable in opposite directions.

* * * * *